(12) United States Patent
Shin

(10) Patent No.: US 9,135,959 B2
(45) Date of Patent: Sep. 15, 2015

(54) MAGNETIC RAMDOM ACCESS MEMORY

(71) Applicant: EWHA UNIVERSITY—INDUSTRY COLLABORATION FOUNDATION, Seoul (KR)

(72) Inventor: Hyung Soon Shin, Seoul (KR)

(73) Assignee: EWHA UNIVERSITY-INDUSTRY COLLABORATION FOUNDATION (KR)

( * ) Notice: Subject to any disclaimer, the term of this patent is extended or adjusted under 35 U.S.C. 154(b) by 179 days.

(21) Appl. No.: 13/859,132

(22) Filed: Apr. 9, 2013

(65) Prior Publication Data
US 2013/0265814 A1    Oct. 10, 2013

(30) Foreign Application Priority Data
Apr. 9, 2012    (KR) .................... 10-2012-0036714

(51) Int. Cl.
  *G11C 11/00*  (2006.01)
  *G11C 5/08*   (2006.01)
  *G11C 11/16*  (2006.01)
  *G11C 5/06*   (2006.01)
  *H01L 27/22*  (2006.01)
(52) U.S. Cl.
  CPC *G11C 5/08* (2013.01); *G11C 5/063* (2013.01); *G11C 11/1659* (2013.01); *H01L 27/228* (2013.01)

(58) Field of Classification Search
  CPC ....................................................... G11C 11/00
  USPC ............................................................ 365/158
  See application file for complete search history.

(56) References Cited

U.S. PATENT DOCUMENTS

2007/0296007 A1* 12/2007 Park et al. ..................... 257/295
2008/0089114 A1*  4/2008 Schloesser ................... 365/154
2010/0271885 A1* 10/2010 Scheuerlein et al. .... 365/189.09

FOREIGN PATENT DOCUMENTS

JP            4461804        2/2010
KR       1020040038420       5/2004
KR       1020040111716      12/2004

* cited by examiner

*Primary Examiner* — Amir Zarabian
*Assistant Examiner* — Min Huang
(74) *Attorney, Agent, or Firm* — Cantor Colburn LLP

(57) ABSTRACT

A magnetic random access memory includes multiple gate lines that are divided into a first gate line group and a second gate line group and arranged to be parallel to one another; multiple magnetic random access memory cells that are bonded to the gate lines in a direction intersected with the gate lines, respectively; multiple source lines that are bonded to one ends of switching devices included in the magnetic random access memory cells and arranged to be parallel to one another; and multiple bit lines that are bonded to one ends of magnetic tunnel junction devices included in the magnetic random access memory cells and arranged to be parallel to one another.

15 Claims, 16 Drawing Sheets

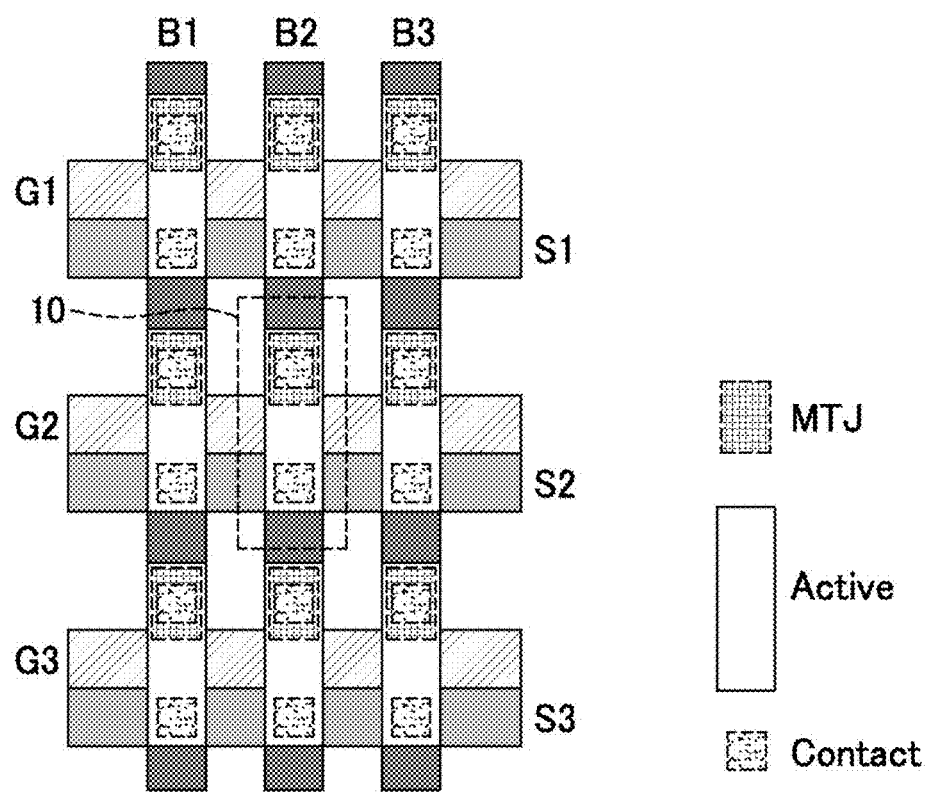
FIG. 1B *Prior Art*

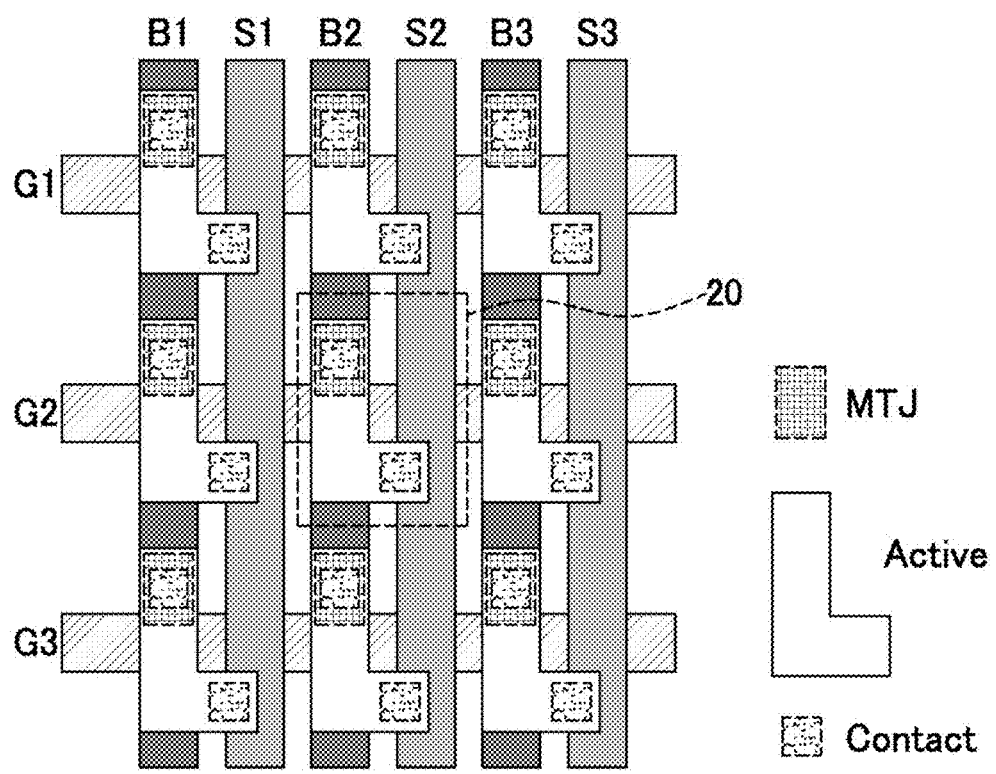
FIG. 2A *Prior Art*

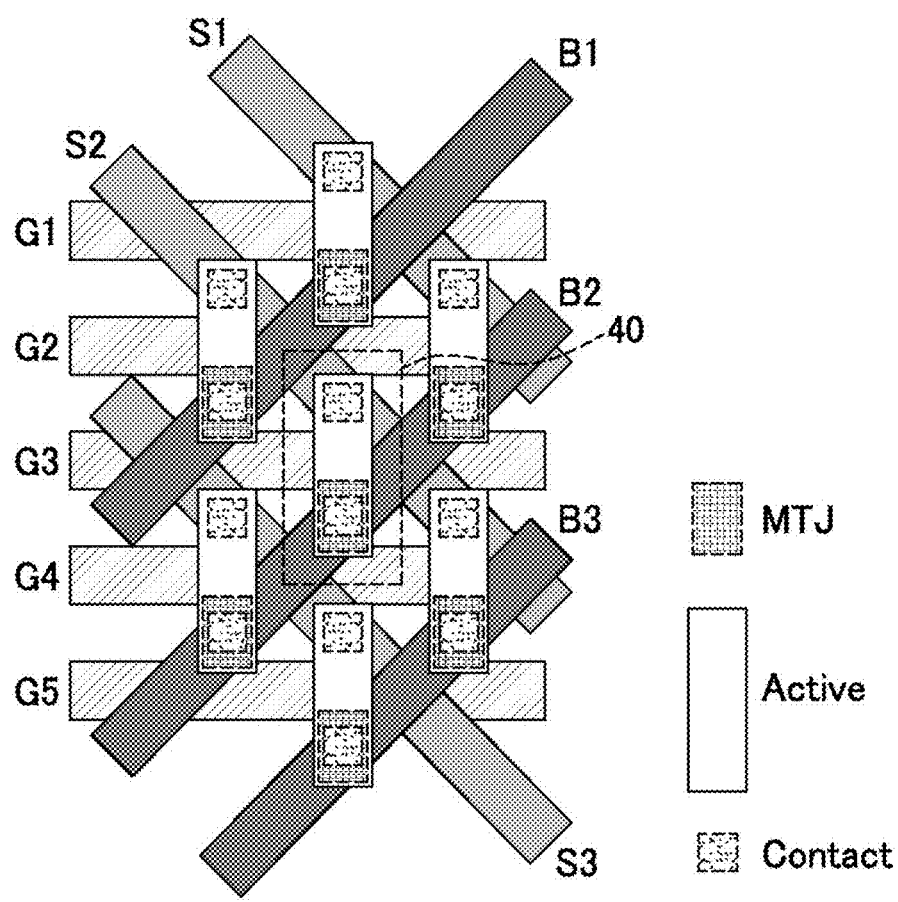

US 9,135,959 B2

MAGNETIC RAMDOM ACCESS MEMORY

CROSS-REFERENCE TO RELATED APPLICATION

This application claims the benefit of Korean Patent Application No. 10-2012-0036714 filed on Apr. 9, 2012, the entire disclosures of which are incorporated herein by reference.

FIELD OF THE INVENTION

The present disclosure relates to a magnetic random access memory (MRAM).

BACKGROUND OF THE INVENTION

A magnetic random access memory (MRAM, hereinafter referred to as "MRAM") is a non-volatile random access memory technology using magnetic elements. By way of example, a spin transfer torque magnetic random access memory (STT-MRAM, hereinafter referred to as "STT-MRAM") uses electrons that become spin-polarized when passing through a thin film (spin filter). The STT-MRAM is also known as a spin transfer torque RAM (STT-RAM), a spin torque transfer magnetization switching RAM (spin-RAM), and a spin momentum transfer RAM (SMT-RAM).

The MRAM is a first generation magnetic memory as a non-volatile random access memory that is capable of reading and writing data, rewriting data unlimited times, and semipermanently storing data at a similar level of a SRAM. However, the MRAM has a small memory capacity and a high power consumption as compared with a DRAM.

Meanwhile, as a new generation magnetic memory, the STT-MRAM avoids a problem of the MRAM with a small memory capacity and is expected to have a memory capacity equivalent to that of the DRAM. The STT-MRAM changes a magnetization direction of a magnetic body by using a magnetic moment generated when electrons are spun and is suitable for miniaturization and high densification.

In a STT-MRAM cell, when a datum "0" is written to a magnetic tunnel junction device, a high voltage is applied to a bit line, and when a datum "1" is written to the magnetic tunnel junction device, a high voltage is applied to a source line. That is, unlike other memory structures, the source line is not grounded (Vss) all the time, a certain level of voltage may be applied to the source line.

FIG. 1A illustrates a structure of a conventional magnetic random access memory. A STT-MRAM includes a transistor, a magnetic tunnel junction device, a gate line, a bit line, and a source line. The magnetic tunnel junction device is comprised of a stationary layer, a magnetization layer, and a thin insulating layer. The gate line and the bit line are arranged so as to be perpendicular to each other. The source line is arranged so as to be typically parallel to the bit line or perpendicular to the bit line depending on a specific architecture used in the STT-MRAM. The bit line is connected to the magnetic tunnel junction device, and the source line is connected to a source of a substrate.

FIGS. 1B and 1C illustrate a cell array of the conventional magnetic random access memory. In a magnetic random access memory cell depicted in FIGS. 1B and 1C, if the source line is arranged so as to be parallel to the gate line, an area of a unit cell 10 can be minimized to 8 $F^2$. However, if the source line is operated with a high voltage in order to write a datum "1", the gate line parallel to the source line is also operated. Thus, a parasitic capacitance to be applied to the source line is greatly increased. Therefore, an operation speed is greatly reduced.

FIGS. 2A and 2B illustrate another cell array of the conventional magnetic random access memory. In order to avoid a problem of the structure depicted in FIG. 1C, FIGS. 2A and 2B use a method in which the source line is arranged so as to be perpendicular to the gate line in the magnetic random access memory to reduce a parasitic capacitance to be applied to the source line. However, in this method, the source line needs to be arranged to be parallel with the bit line while avoiding a short circuit at a contact between the magnetic tunnel junction device and an active layer. Thus, an area of a unit cell 20 can be increased to 12 $F^2$.

In this regard, Korean Patent Laid-open Publication No. 10-2004-0111716 (entitled "Dense array structure for non-volatile semiconductor memories") describes a semiconductor memory device having an array arrangement of overlapped word lines and diagonal bit lines in a column direction and a row direction. Further, Korean Patent No. 10-0536592 (entitled "Magnetic memory and method for fabricating the same") describes a magnetic memory including a magnetic tunnel junction device and a method for arranging a bit line and a digit line to be intersected with each other.

BRIEF SUMMARY OF THE INVENTION

In view of the foregoing, some illustrative embodiments of the present disclosure provide a magnetic random access memory including an improved layout structure of a source line or a bit line.

In accordance with a first aspect of the illustrative embodiments, there is provided a magnetic random access memory. The magnetic random access memory includes multiple gate lines that are divided into a first gate line group and a second gate line group and arranged to be parallel to one another; multiple magnetic random access memory cells that are bonded to the gate lines in a direction intersected with the gate lines, respectively; multiple source lines that are bonded to one ends of switching devices included in the magnetic random access memory cells and arranged to be parallel to one another; and multiple bit lines that are bonded to one ends of magnetic tunnel junction devices included in the magnetic random access memory cells and arranged to be parallel to one another. And, the other ends of the switching devices and the other ends of the magnetic tunnel junction devices are connected to each other in series, the magnetic random access memory cell bonded to the first gate line group is arranged so as not to be adjacent to the magnetic random access memory cell bonded to the second gate line group, and the source lines and the bit lines are bonded to the magnetic random access memory cell bonded to the gate lines different from each other and the source lines and the bit lines are arranged so as to be intersected with each other.

Further, in accordance with a second aspect of the illustrative embodiments, there is provided a magnetic random access memory. The magnetic random access memory includes multiple gate lines that are arranged to be parallel to one another; multiple bit lines that are divided into a first bit line group and a second bit line group, extended in a direction perpendicular to the gate lines, and arranged to be parallel to one another; multiple magnetic random access memory cells that are bonded to intersection points between the gate lines and the bit lines; and multiple source lines that are bonded to one ends of switching devices included in the magnetic random access memory cells, respectively, and arranged to be parallel to one another. And, the other ends of the switching devices and the other ends of magnetic tunnel junction devices are connected to each other in series, a magnetic tunnel junction device included in a magnetic random access memory cell bonded to the first bit line group and a magnetic tunnel junction device included in a magnetic random access memory cell bonded to the second bit line group are connected to the switching devices, respectively, so as not to be adjacent to each other, the bit line is connected to one end of the magnetic tunnel junction device included in the magnetic random access memory cell, and the source line is extended in a direction so as to be connected to one ends of the switching devices of adjacent magnetic random access memory cells bonded to a same gate line and adjacent bit lines different from each other.

Furthermore, in accordance with a third aspect of the illustrative embodiments, there is provided a magnetic random access memory. The magnetic random access memory includes multiple gate lines that are arranged to be parallel to one another; multiple source lines that are divided into a first source line group and a second source line group, extended in a direction perpendicular to the gate lines, and arranged to be parallel to one another; multiple magnetic random access memory cells that are bonded to intersection points between the gate lines and the source lines; and multiple bit lines that are bonded to one ends of magnetic tunnel junction devices included in the magnetic random access memory cells, respectively, and arranged to be parallel to one another. And, the other ends of switching devices and the other ends of the magnetic tunnel junction devices are connected to each other in series, a magnetic tunnel junction device included in a magnetic random access memory cell bonded to the first source line group and a magnetic tunnel junction device included in a magnetic random access memory cell bonded to the second source line group are connected to the switching devices, respectively, so as not to be adjacent to each other, the source line is connected to one end of the switching device included in the magnetic random access memory cell, and the bit line is extended in a direction so as to be connected to one ends of the magnetic tunnel junction devices of adjacent magnetic random access memory cells bonded to a same gate line and adjacent source lines different from each other.

In accordance with the illustrative embodiments, if a source line or a bit line is arranged in a diagonal direction, a parasitic capacitance is not increased, and, thus, an operation speed of the source line can be increased as compared with a conventional magnetic random access memory. Further, to reduce a parasitic capacitance in a typical magnetic random access memory, a unit cell area is increased. However, in accordance with the present disclosure, a source line or a bit line is arranged in a direction diagonal to a gate line, so that a unit cell area can be minimized.

BRIEF DESCRIPTION OF THE DRAWINGS

FIGS. 1B and 1C illustrate a cell array of the conventional magnetic random access memory.

FIGS. 2A and 2B illustrate another cell array of the conventional magnetic random access memory.

FIGS. 4A and 4B illustrate a magnetic random access memory in accordance with a second illustrative embodiment.

DETAILED DESCRIPTION OF THE INVENTION

Figure 1A:
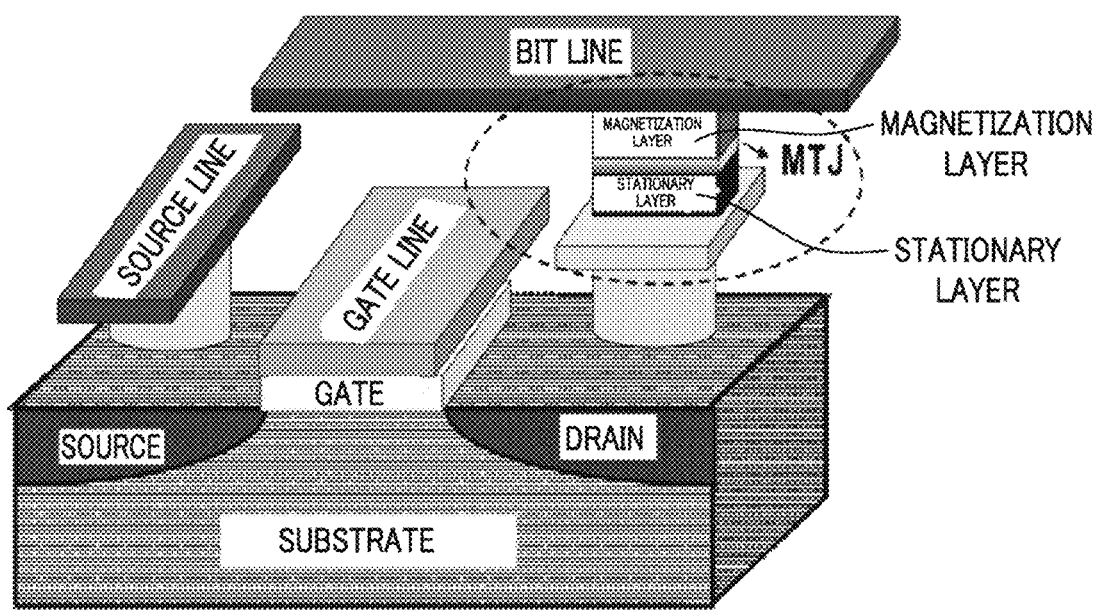
FIG. 1A illustrates a structure of a conventional magnetic random access memory.
Figure 1C:
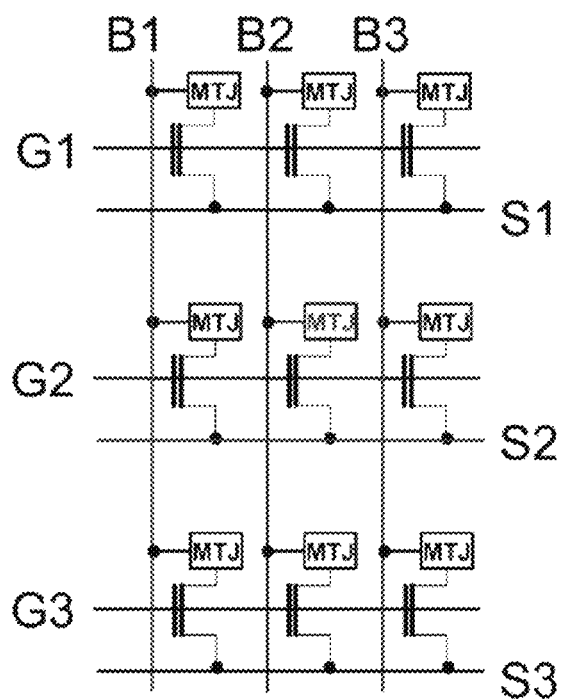
Figure 2B:
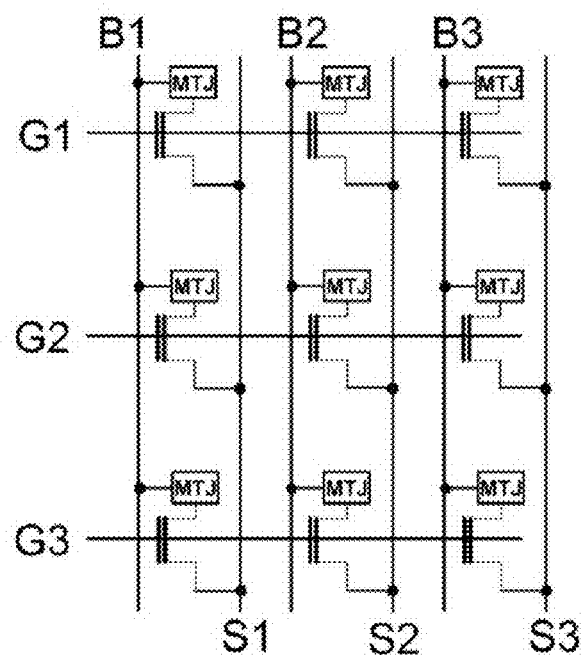

Hereinafter, examples of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

Figure 3A:
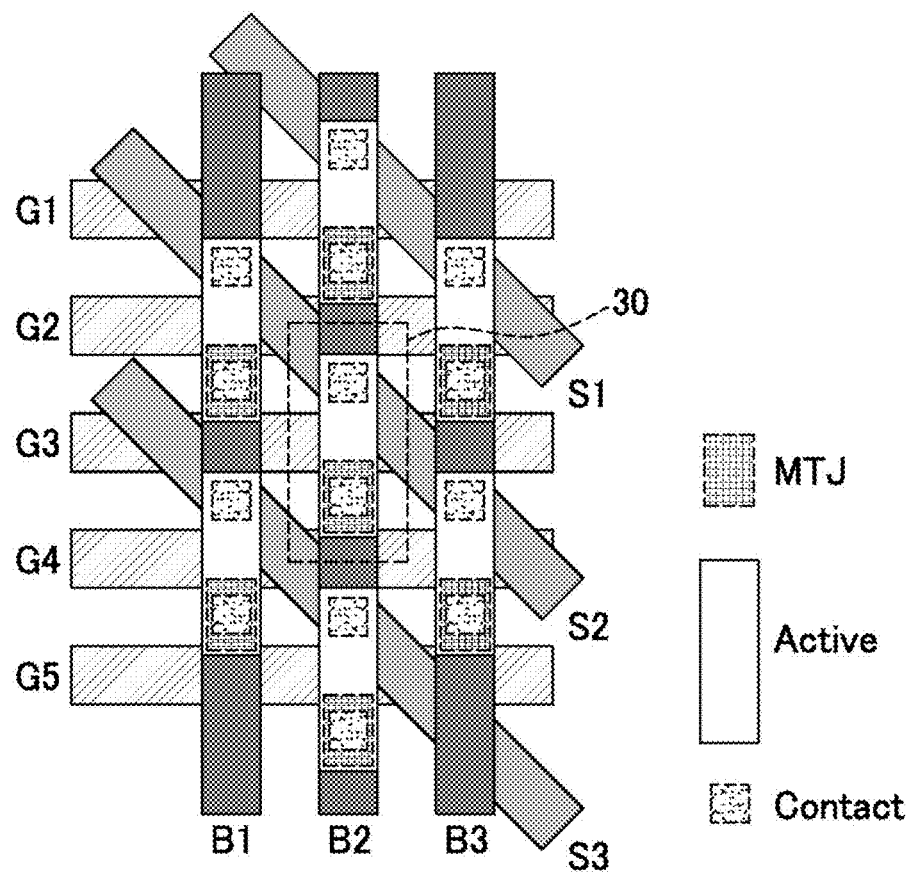
FIGS. 3A and 3B illustrate a magnetic random access memory in accordance with a first illustrative embodiment.
Figure 3B:
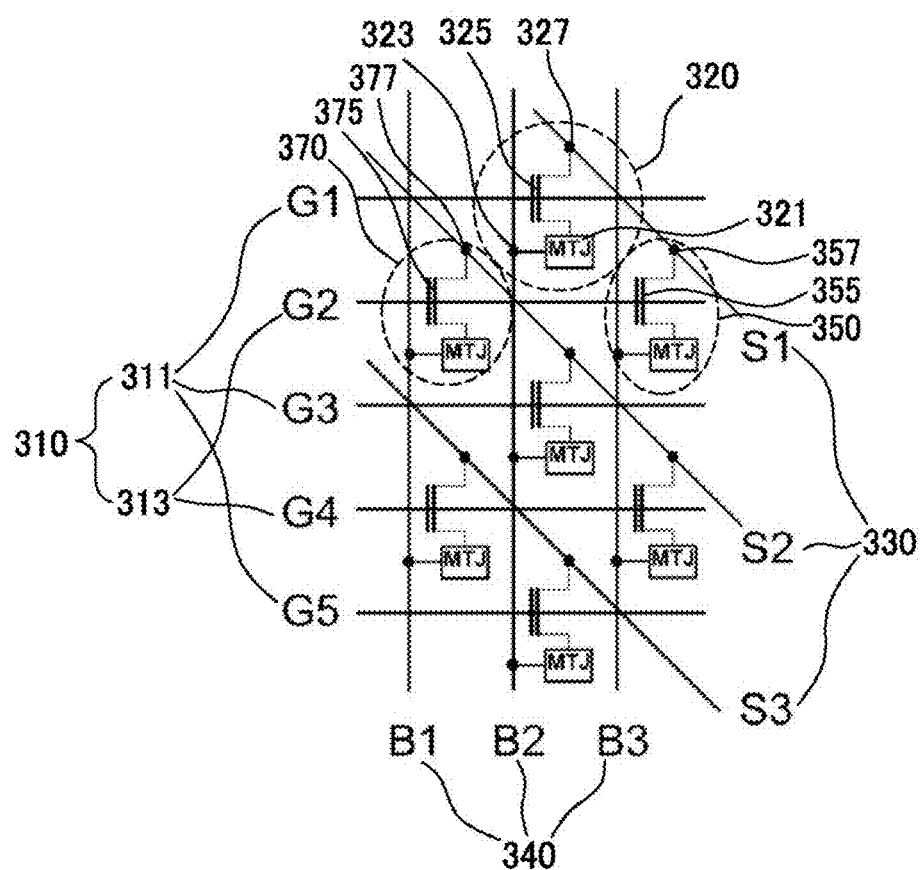

FIGS. 3A and 3B illustrate a magnetic random access memory in accordance with a first illustrative embodiment A magnetic random access memory includes gate lines 310, magnetic random access memory cells 320, source lines 330, and bit lines 340.

The gate lines 310 are divided into a first gate line group 311 and a second gate line group 313. The first gate line group 311 includes odd-numbered gate lines or even-numbered gate lines. If the first gate line group 311 includes the odd-numbered gate lines, the second gate line group 313 includes the even-numbered gate lines. The multiple gate lines 310 are arranged so as to be parallel to one another.

The multiple magnetic random access memory cells 320 are bonded to the gate lines 310 in a direction intersected with the gate lines 310, respectively. Each of the magnetic random access memory cells 320 includes a magnetic tunnel junction device 321 and a switching device 325. One end 323 of the magnetic tunnel junction device 321 is connected to the bit line 340 and one end 327 of the switching device 325 is connected to the source line 330. Further, the other end of the magnetic tunnel junction device 321 and the other end of the switching device 325 are connected to each other in series.

A magnetic random access memory cell bonded to the first gate line group 311 is arranged so as not to be adjacent to a magnetic random access memory cell bonded to the second gate line group 313. With this structure, a single cell can maintain a specific area and the source lines 330 and the gate lines 310 can be arranged so as not to be parallel to each other.

The source line 330 is connected to the one end 327 of the switching device 325 included in the magnetic random access memory cell 320. The multiple source lines 330 are arranged so as to be parallel to one another.

The bit line 340 is connected to the one end 323 of the magnetic tunnel junction device 321 included in the magnetic random access memory cell 320. The multiple bit lines 340 are arranged so as to be parallel to one another.

The source line 330 and the bit line 340 are bonded to the magnetic random access memory cells 320 bonded to the gate lines 310 different from each other. That is, a first source line is bonded to a magnetic random access memory cell of a first gate line but is not bonded again to the magnetic random access memory cell of the first gate line, and a first bit line is bonded to a magnetic random access memory cell of the first gate line but is not bonded again to the magnetic random access memory cell of the first gate line.

The source line 330 and the bit line 340 are arranged so as to be intersected with each other.

FIG. 3B illustrates a magnetic random access memory example in which the source lines 330 are arranged in a direction diagonal to the gate lines 310 and the bit lines 340.

The bit lines 340 are arranged in a direction perpendicular to the gate lines 310. The source lines 330 can be connected to the one ends 327 of the switching devices 325 of the magnetic random access memory cells bonded to the gate lines 310 different from each other and bonded to the bit lines 340 different from each other.

Therefore, the source line 330 is extended in a diagonal direction while being connected to the one end 327 of the switching device 325 included in the magnetic random access memory cell 320 bonded to a Nth gate line G1 and a Mth bit line B2 and connected to one end 357 of a switching device 355 included in a magnetic random access memory cell 350 bonded to a N+1th gate line G2 and a M+1th bit line B3.

The source line 330 may be extended in an opposite diagonal direction while being connected to one end 377 of a switching device 375 included in a magnetic random access memory cell 370 bonded to a M−1th bit line B1 instead of the M+1th bit line B3.

By way of example, the source line 330 can be extended in a direction so as to be connected to the one end 327 of the switching device 325 included in the magnetic random access memory cell 320 bonded to the first gate line G1 and the second bit line B2 and connected to the one end 357 of the switching device 355 included in the magnetic random access memory cell 350 bonded to the second gate line G2 and the third bit line B3. The source line 330 can be extended in an opposite diagonal direction so as to be bonded to the magnetic random access memory cell 320 bonded to the first gate line G1 and the second bit line B2 and then bonded to the magnetic random access memory cell 370 bonded to the second gate line G2 and the first bit line B1.

Figure 4B:
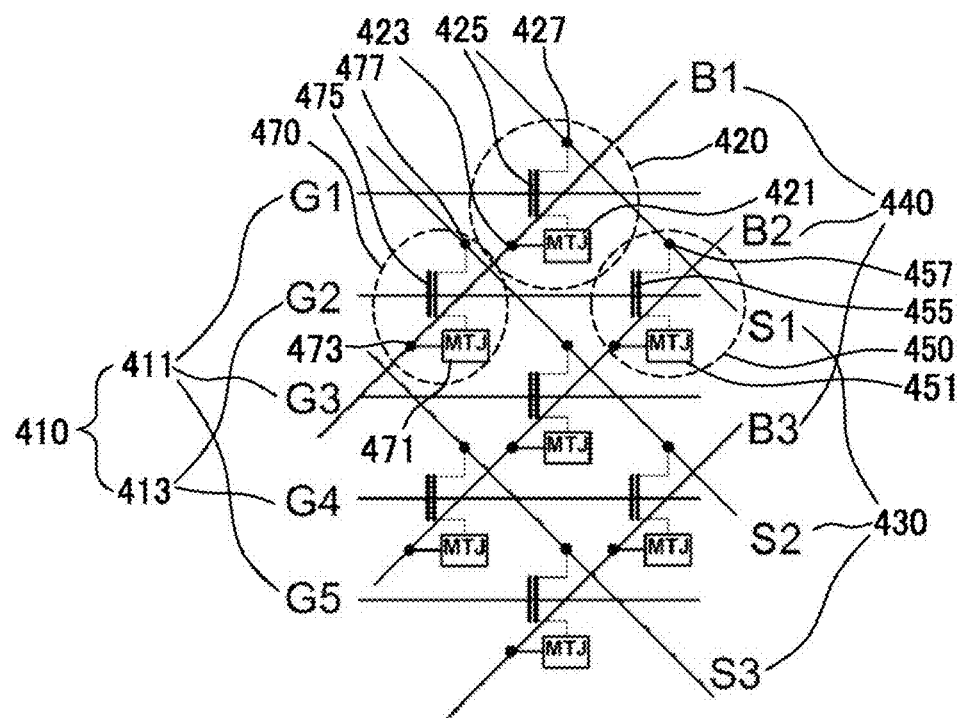

FIGS. 4A and 4B illustrate a magnetic random access memory in accordance with a second illustrative embodiment.

In accordance with the present illustrative embodiment, source lines 430 and bit lines 440 are intersected with each other so as not to be perpendicular to gate lines 410.

The source line 430 can be extended in a diagonal direction so as to be connected to one end 427 of a switching device 425 included in a magnetic random access memory cell 420 bonded to a Nth gate line G1 and a Mth bit line B1 and an one end 457 of a switching device 455 included in a magnetic random access memory cell 450 bonded to a N+1th gate line G2 and a M+1th bit line B2. In this case, the bit line 440 can be extended in a diagonal direction so as to be connected to one end 423 of a magnetic tunnel junction device 421 included in the magnetic random access memory cell 420 bonded to the Nth gate line G1 and a Kth source line S1 and an one end 473 of a magnetic tunnel junction device 471 included in a magnetic random access memory cell 470 bonded to the N+1th gate line G2 and a K+1th source line S2.

Otherwise, the source line 430 and the bit line 440 may be arranged in an opposite diagonal direction. In this case, the source line 430 can be extended in a diagonal direction so as to be connected to the one end 427 of the switching device 425 included in the magnetic random access memory cell 420 bonded to the Nth gate line G1 and a Mth bit line B1 and an one end 477 of a switching device 475 included in the magnetic random access memory cell 470 bonded to the N+1th gate line G2 and the M+1th bit line B2. In this case, the bit line 440 can be extended in a diagonal direction so as to be connected to the one end 423 of the magnetic tunnel junction device 421 included in the magnetic random access memory cell 420 bonded to the Nth gate line G1 and the Kth source line S1 and an one end 453 of a magnetic tunnel junction device 451 included in the magnetic random access memory cell 450 bonded to the N+1th gate line G2 and the K+1th source line S2.

By way of example, the source line 430 can be extended so as to be connected to the one end 427 of the switching device 425 included in the magnetic random access memory cell 420 bonded to the first gate line G1 and the first bit line B1 and the one end 457 of the switching device 455 included in the magnetic random access memory cell 450 bonded to the second gate line G2 and the second bit line B2. In this case, the bit line 440 can be extended so as to be connected to the one end 423 of the magnetic tunnel junction device 421 included in the magnetic random access memory cell 420 bonded to the first gate line G1 and the first source line S1 and the one end 473 of the magnetic tunnel junction device 471 included in the magnetic random access memory cell 470 bonded to the second gate line G2 and the second source line S2.

Otherwise, the source line 430 and the bit line 440 may be arranged in an opposite diagonal direction. In this case, the source line 430 can be extended so as to be connected to the one end 427 of the switching device 425 included in the magnetic random access memory cell 420 bonded to the first gate line G1 and the first bit line B1 and the one end 477 of the switching device 475 included in the magnetic random access memory cell 470 bonded to the second gate line G2 and the second bit line B2. In this case, the bit line 440 can be extended so as to be connected to the one end 423 of the magnetic tunnel junction device 421 included in the magnetic random access memory cell 420 bonded to the first gate line G1 and the first source line S1 and the one end 453 of the magnetic tunnel junction device 451 included in the magnetic random access memory cell 450 bonded to the second gate line G2 and the second source line S2.

Figure 5A:
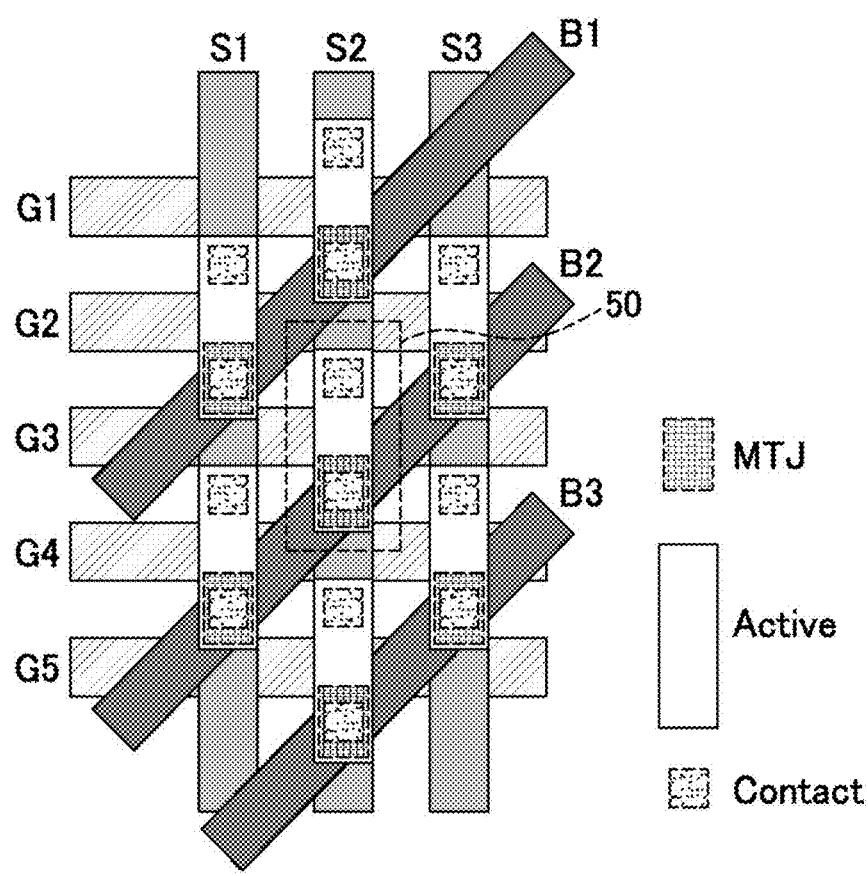
FIGS. 5A and 5B illustrate a magnetic random access memory in accordance with a third illustrative embodiment.
Figure 5B:
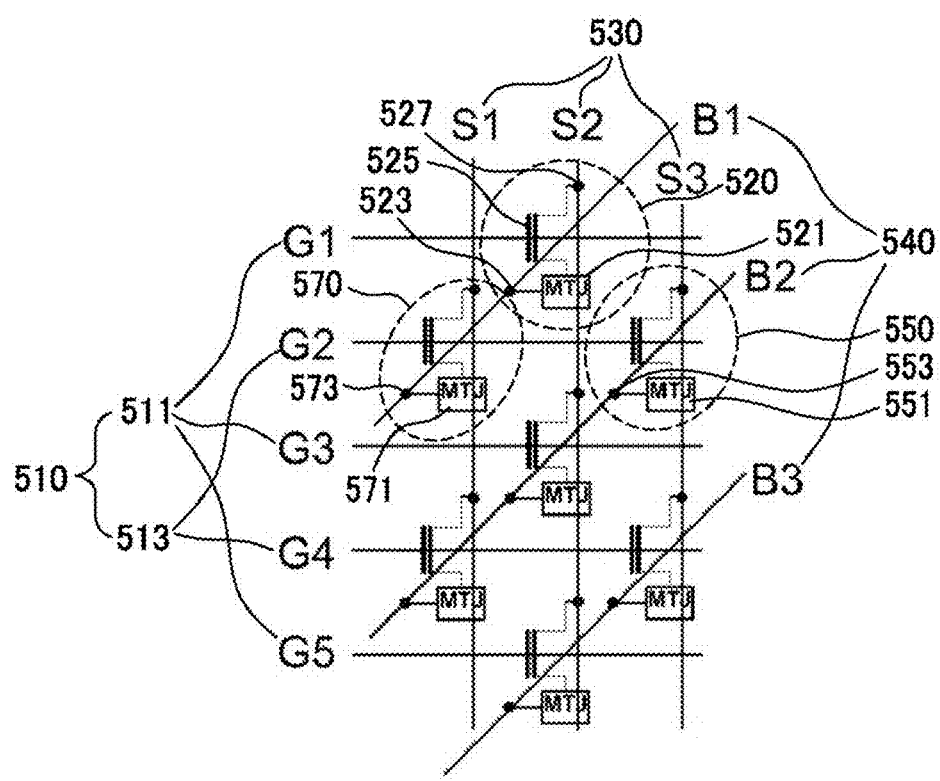

FIGS. 5A and 5B illustrate a magnetic random access memory in accordance with a third illustrative embodiment.

In the magnetic random access memory in accordance with the third illustrative embodiment, bit lines 540 are arranged in a direction diagonal to gate lines 510 and source lines 530.

The bit lines 540 can be connected to one ends 523 of magnetic tunnel junction devices 521 of magnetic random access memory cells 520 bonded to the gate lines 510 different from each other and bonded to the source lines 530 different from each other.

To be specific, the bit line 540 is extended in a diagonal direction while being connected to the one end 523 of the magnetic tunnel junction device 521 included in the magnetic random access memory cell 520 bonded to a Nth gate line G1 and a Mth source line S2 and connected to one end 573 of a magnetic tunnel junction device 571 included in a magnetic random access memory cell 570 bonded to a N+1th gate line G2 and a M−1th source line S1.

Otherwise, the bit line 540 may be extended in an opposite diagonal direction while being connected to one end 533 of a magnetic tunnel junction device 551 included in a magnetic random access memory cell 550 bonded to a M+1th source line S3 instead of the M−1th source line S1.

By way of example, the bit line 540 can be extended in a direction so as to be connected to the one end 523 of the magnetic tunnel junction device 521 included in the magnetic random access memory cell 520 bonded to the first gate line G1 and the second source line S2 and the one end 553 of the magnetic tunnel junction device 551 included in the magnetic random access memory cell 550 bonded to the second gate line G2 and the third source line S3. The bit line 540 can be extended in an opposite diagonal direction so as to be bonded to the magnetic random access memory cell 520 bonded to the first gate line G1 and the second source line S2 and then connected to the one end 573 of the magnetic tunnel junction device 571 included in the magnetic random access memory cell 570 bonded to the second gate line G2 and the first source line S1.

Figure 6A:
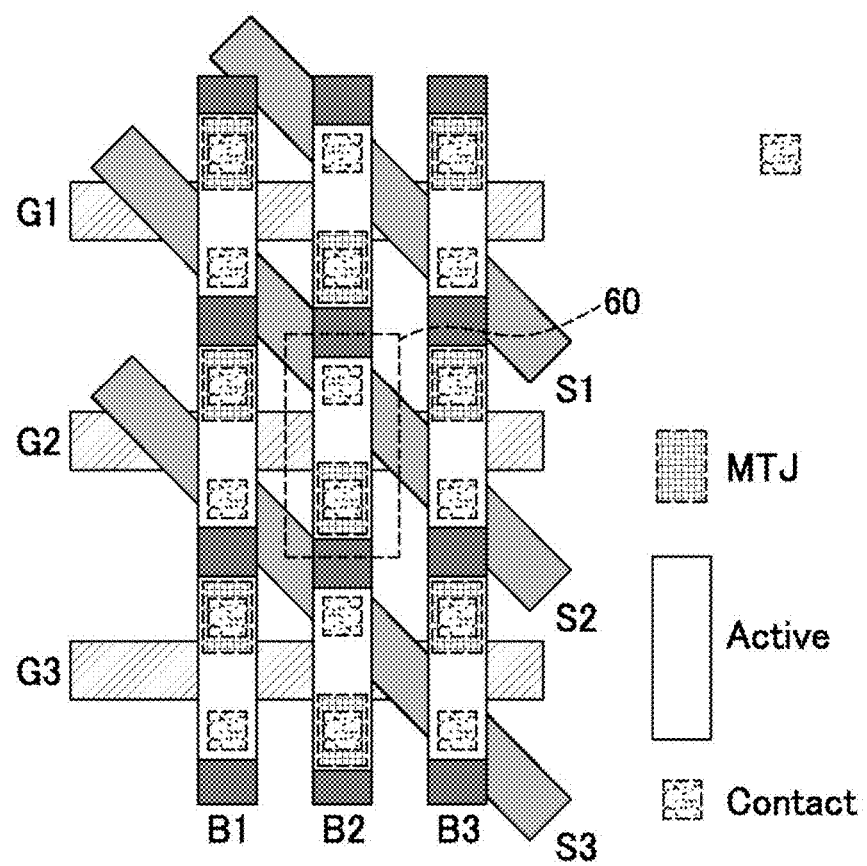
FIGS. 6A and 6B illustrate a magnetic random access memory in accordance with a fourth illustrative embodiment.
Figure 6B:
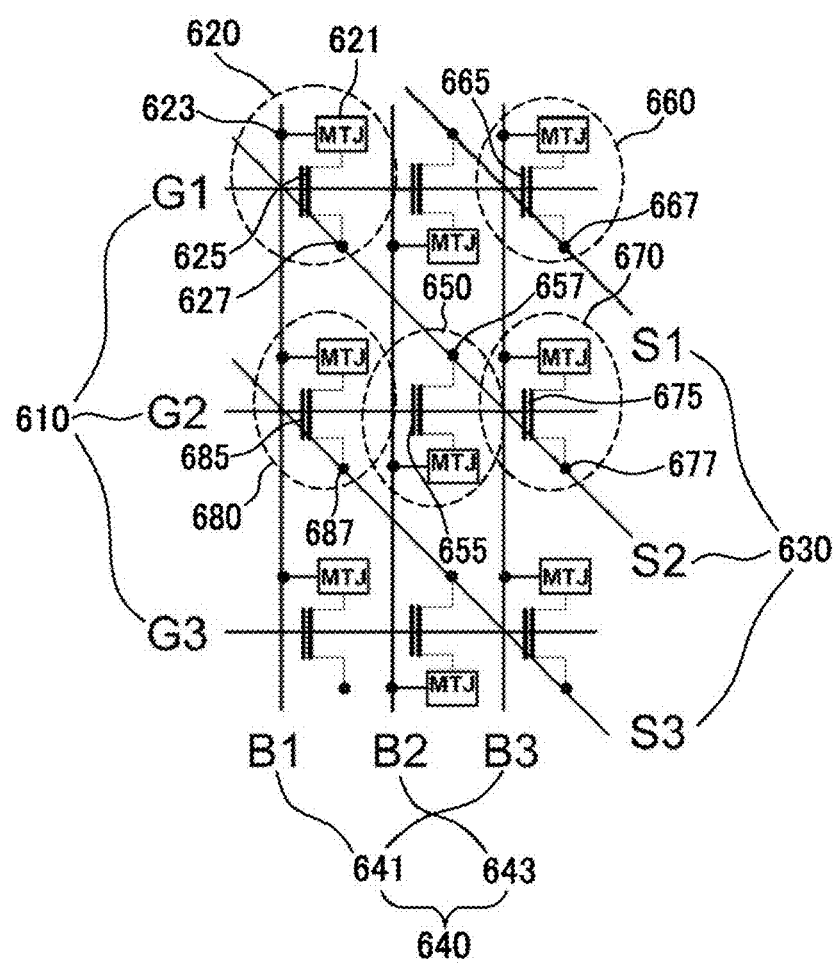

FIGS. 6A and 6B illustrate a magnetic random access memory in accordance with a fourth illustrative embodiment.

Unlike the first to third illustrative embodiments, in the fourth illustrative embodiment, magnetic random access memory cells 620 are arranged at intersection points between gate lines 610 and bit lines 640, respectively, and magnetic tunnel junction devices 621 included in the magnetic random access memory cells 620 connected to the same gate line are arranged alternately so as not to be adjacent to each other.

The multiple gate lines 610 are arranged so as to be parallel to one another. The bit lines 640 are arranged in a direction perpendicular to the gate lines 610. Meanwhile, the bit lines 640 are divided into a first bit line group 641 and a second bit line group 643. The first gate line group 641 may include odd-numbered bit lines or even-numbered bit lines. If the first bit line group 641 includes the odd-numbered bit lines, the second bit line group 643 includes the even-numbered bit lines. The multiple bit lines 640 are arranged so as to be parallel to one another.

The source line 630 is extended in a direction so as to be connected to one ends 657 and 677 of switching devices 655 and 675 included in two continuous magnetic random access memory cells 650 and 670 bonded to the same gate line. In this case, the magnetic random access memory cells 650 and 670 are bonded to adjacent bit lines B2 and B3 different from each other.

To be specific, the source line 630 is extended in a direction so as to be connected to one end 627 of a switching device 625 included in the magnetic random access memory cell 620 bonded to a Nth gate line G1 and a M−1th bit line B1 and the one ends 657 and 677 of the switching devices 655 and 675 respectively included in the magnetic random access memory cell 650 bonded to a N+1th gate line G2 and a Mth bit line B2 and the magnetic random access memory cell 670 adjacent to the magnetic random access memory cell 650 and bonded to the N+1th gate line G2 and a M+1th bit line B3.

The source line 630 may be extended in an opposite diagonal direction so as to be connected to one end 667 of a switching device 665 included in a magnetic random access memory cell 660 bonded to the Nth gate line G1 and the M+1th gate line B3 and one ends 657 and 687 of switching devices 655 and 685 respectively included in the magnetic random access memory cell 650 bonded to the N+1th gate line G2 and the Mth bit line B2 and a magnetic random access memory cell 680 adjacent to the magnetic random access memory cell 650 and bonded to the N+1th gate line G2 and the M−1th bit line B1.

Figure 7A:
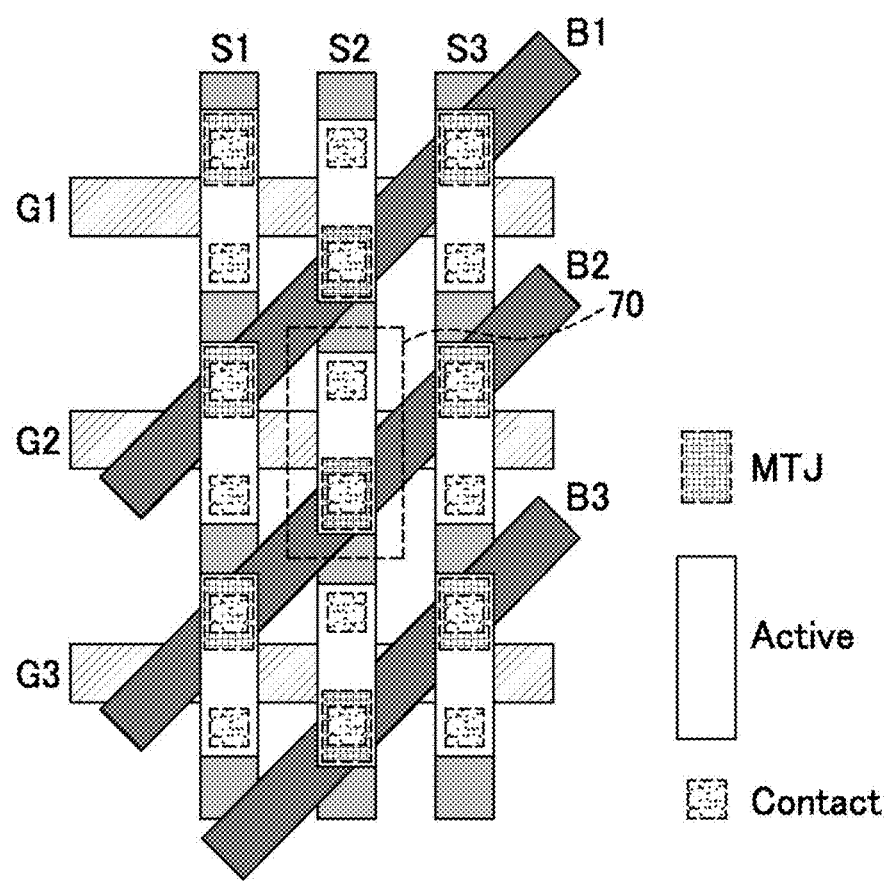
FIGS. 7A and 7B illustrate a magnetic random access memory in accordance with a fifth illustrative embodiment.
Figure 7B:
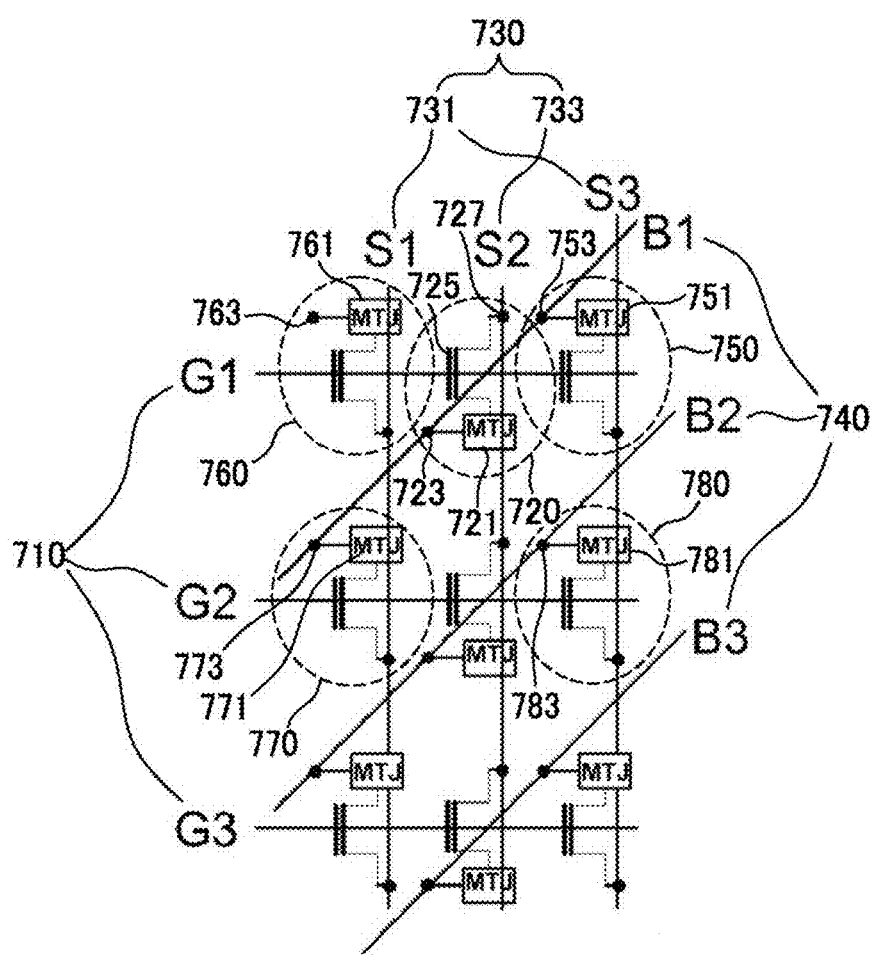

FIGS. 7A and 7B illustrate a magnetic random access memory in accordance with a fifth illustrative embodiment.

As also can be seen from FIG. 5B, in a magnetic random access memory in the fifth illustrative embodiment, bit lines 740 are arranged in a direction diagonal to gate lines 710 and source lines 730.

The multiple gate lines 710 are arranged so as to be parallel to one another, and the source lines 730 are arranged in a direction perpendicular to the gate lines 710.

The source lines 730 are divided into a first source line group 731 and a second source line group 733. The first source line group 731 may include odd-numbered source lines or even-numbered source lines. If the first source line group 731 includes the odd-numbered source lines, the second source line group 733 includes the even-numbered source lines. The source line 730 is bonded to one end 727 of a switching device 725 included in a magnetic random access memory cell 720, and the multiple source lines 730 are arranged so as to be parallel to one another.

The magnetic random access memory cells 720 are arranged at intersection points between the gate lines 710 and the source lines 730, respectively. Each of the magnetic random access memory cells 720 includes a magnetic tunnel junction device 721 and a switching device 725. One end 723 of the magnetic tunnel junction device 721 is connected to the bit line 740 and one end 727 of the switching device 725 is connected to the source line 730. Further, the other end of the magnetic tunnel junction device 721 and the other end of the switching device 725 are connected to each other in series.

Magnetic tunnel junction devices 721 and 751 included in magnetic random access memory cells 720 and 750 bonded to the same gate line are arranged alternately so as not to be adjacent to each other.

The bit line 740 is extended in a direction so as to be connected to one ends 723 and 753 of magnetic tunnel junction devices 721 and 751 included in the two continuous magnetic random access memory cells 720 and 750 bonded to the same gate line. In this case, the magnetic random access memory cells 720 and 750 are bonded to adjacent source lines different from each other.

To be specific, the bit line 740 is extended in a direction so as to be connected to the one ends 723 and 753 of the magnetic tunnel junction devices 721 and 751 respectively included in the magnetic random access memory cell 720 bonded to a Nth gate line G1 and a Mth source line S2 and the magnetic random access memory cell 750 adjacent to the magnetic random access memory cell 720 and bonded to the Nth gate line G1 and a M+1th source line S3 and connected to one end 773 of a magnetic tunnel junction device 771 of a magnetic random access memory cell 770 bonded to a N+1th gate line G2 and a M−1th source line S1.

Further, the bit line 740 may be extended in an opposite diagonal direction so as to be connected to one ends 723 and 763 of the magnetic tunnel junction devices 721 and 761 respectively included in the magnetic random access memory cell 720 bonded to a Nth gate line G1 and the Mth source line S2 and a magnetic random access memory cell 760 adjacent to the magnetic random access memory cell 720 and bonded to the Nth gate line G1 and a M−1th source line S1 and connected to one end 783 of a magnetic tunnel junction device 781 of a magnetic random access memory cell 780 bonded to the N+1th gate line G2 and the M+1th source line S3.

As described above, the source lines 330, 630, and 730 are arranged so as to be intersected with the bit lines 340, 640, and 740. Thus, areas of unit cells 30, 40, 50, 60, and 70 can be minimized to, for example, 8 $F^2$ and also, an a parasitic capacitance to be applied to the source lines 330, 630, and 730 can be reduced. Therefore, an operation speed of the source line can be increased.

Figure 8:
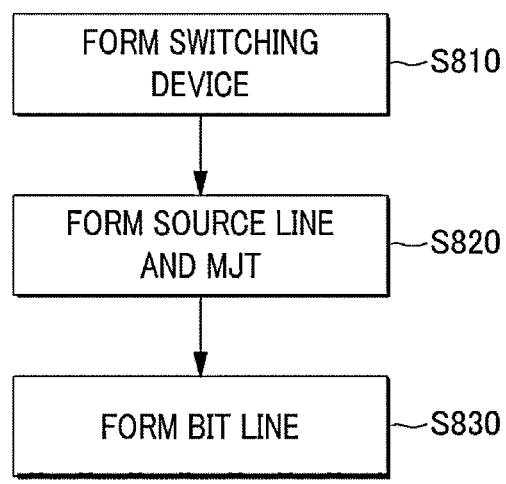
FIG. 8 illustrates a process for fabricating a magnetic random access memory in accordance with an illustrative embodiment.

FIG. 8 illustrates a process for fabricating a magnetic random access memory in accordance with an illustrative embodiment.

A switching device of a magnetic random access memory cell is formed on a substrate in order to achieve a magnetic random access memory depicted in FIG. 3B (S810). At this time, a gate line connected to a gate and a contact connected to a source and a drain are formed.

Then, a source line and a magnetic tunnel junction device are formed (S820). At this time, a photoresist is patterned in diagonal lines, and, thus, it is possible to form source lines arranged in a diagonal direction.

When the source lines are arranged in the diagonal direction, bit lines are formed thereon (S830). This process can be applied to the illustrative embodiments depicted in FIGS. 4B and 6B.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A magnetic random access memory comprising:
multiple gate lines that are divided into a first gate line group and a second gate line group and arranged to be parallel to one another;
multiple magnetic random access memory cells that are bonded to the multiple gate lines respectively;
multiple source lines that are bonded to one ends of switching devices included in the magnetic random access memory cells and arranged to be parallel to one another; and
multiple bit lines that are bonded to one ends of magnetic tunnel junction devices included in the magnetic random access memory cells and arranged to be parallel to one another,
wherein the multiple source lines are extended in diagonal direction with respect to the bit lines, and the multiple bit lines are extended in direction intersected with the gate line and the source line,
the other ends of the switching devices and the other ends of the magnetic tunnel junction devices are connected to each other in series,
the magnetic random access memory cell bonded to the first gate line group is bonded in a diagonal direction so as to be adjacent to the magnetic random access memory cell bonded to the second gate line group,
any one of the multiple bit lines is bonded to the magnetic random access memory cells which are bonded to any one of the first gate line group and the second gate line group,
the source lines and the bit lines are bonded to the magnetic random access memory cell bonded to the gate lines different from each other and the source lines and the bit lines are arranged so as to be intersected with each other, and
if the first gate line group is an even number, the second gate line is odd number, and if the first gate line group is an odd number, the second gate line is even number.

2. The magnetic random access memory of claim 1, wherein the bit lines is arranged in a direction perpendicular to the gate line, and the source line is connected to the one ends of the switching devices included in the magnetic random access memory cells bonded to the gate lines different from each other and the bit lines different from each other.

3. The magnetic random access memory of claim 2, wherein the source line is extended in a diagonal direction so as to be connected to one end of a switching device included in a magnetic random access memory cell bonded to a Nth (N≥1) gate line and a (M+1)th (M≥1) bit line and
one end of a switching device included in a magnetic random access memory cell bonded to a (N+1)th gate line and a Mth bit line.

4. The magnetic random access memory of claim 2, wherein the source line is extended in a diagonal direction so as to be connected to one end of a switching device included in a magnetic random access memory cell bonded to a Nth (N≥1) gate line and a Mth (M≥1) bit line and
one end of a switching device included in a magnetic random access memory cell bonded to a (N+1)th gate line and a (M+1)th bit line.

5. The magnetic random access memory of claim 1, wherein the source line and the bit line are intersected with each other so as not to be perpendicular to the gate line.

6. The magnetic random access memory of claim 5, wherein the source line is extended in a diagonal direction so as to be connected to one end of a switching device included in a magnetic random access memory cell bonded to a Nth (N≥1) gate line and a Mth (M≥1) bit line and
one end of a switching device included in a magnetic random access memory cell bonded to a (N+1)th gate line and a (M+1)th bit line, and
the bit line is extended in a diagonal direction so as to be connected to one end of a magnetic tunnel junction device included in a magnetic random access memory cell bonded to the Nth gate line and a Kth (K≥1) source line and
one end of a magnetic tunnel junction device included in a magnetic random access memory cell bonded to the (N+1)th gate line and a (K+1)th source line.

7. The magnetic random access memory of claim 1, wherein the source line is arranged in a direction perpendicular to the gate line, and
the bit line is bonded to one ends of magnetic tunnel junction devices of magnetic random access memory cells bonded to the gate lines different from each other and the source lines different from each other.

8. The magnetic random access memory of claim 7, wherein the bit line is extended in a diagonal direction so as to be connected to one end of a magnetic tunnel junction device included in a magnetic random access cell bonded to a Nth (N≥1) gate line and a Mth (M≥1) source line and
one end of a magnetic tunnel junction device included in a magnetic random access cell bonded to a (N+1)th gate line and a (M+1)th source line.

9. The magnetic random access memory of claim 7, wherein the bit line is extended in a diagonal direction so as to be connected to one end of a magnetic tunnel junction device included in a magnetic random access cell bonded to a Nth (N≥1) gate line and a Mth (M≥1) source line and
one end of a magnetic tunnel junction device included in a magnetic random access cell bonded to a (N+1)th gate line and a Mth source line.

10. A magnetic random access memory comprising:
multiple gate lines that are arranged to be parallel to one another;
multiple bit lines that are divided into a first bit line group and a second bit line group, extended in a direction perpendicular to the gate lines, and arranged to be parallel to one another;
multiple magnetic random access memory cells that are bonded to intersection points between the gate lines and the bit lines; and
multiple source lines that are bonded to one ends of switching devices included in the magnetic random access memory cells, respectively, and arranged to be parallel to one another,
wherein the other ends of the switching devices and the other ends of magnetic tunnel junction devices are connected to each other in series,
a magnetic tunnel junction device included in a magnetic random access memory cell bonded to the first bit line group and a magnetic tunnel junction device included in a magnetic random access memory cell bonded to the second bit line group are arranged in opposite directions to each other and connected to the switching devices, respectively, so as not to be adjacent to each other,
the bit line is connected to one end of the magnetic tunnel junction device included in the magnetic random access memory cell,
the source line is extended in a diagonal direction so as to be connected to one ends of the switching devices of adjacent two magnetic random access memory cells bonded to a same gate line and adjacent bit lines different from each other, and
if the first bit line group is an even number, the second bit line is odd number, and if the first bit line group is an odd number, the second bit line is even number.

11. The magnetic random access memory of claim 10,
wherein the source line is extended in a direction so as to be connected to one end of a switching device included in a magnetic random access memory cell bonded to a Nth (N≥1) gate line and a Mth (M≥1) bit line, and
one ends of switching devices respectively included in a magnetic random access memory cell bonded to a N+1th gate line and a (M+1)th bit line and a magnetic random access memory cell adjacent to the magnetic random access memory cell and bonded to the (N+1)th gate line and a (M+2)th bit line.

12. The magnetic random access memory of claim 10,
wherein the source line is extended in a direction so as to be connected to one end of a switching device included in a magnetic random access memory cell bonded to a Nth (N≥1) gate line and a (M+2)th (M≥1) bit line and
one ends of switching devices respectively included in a magnetic random access memory cell bonded to a (N+1)th gate line and a Mth bit line and a magnetic random access memory cell adjacent to the magnetic random access memory cell and bonded to the (N+1)th gate line and a (M+1)the bit line.

13. A magnetic random access memory comprising:
multiple gate lines that are arranged to be parallel to one another;
multiple source lines that are divided into a first source line group and a second source line group, extended in a direction perpendicular to the gate lines, and arranged to be parallel to one another;
multiple magnetic random access memory cells that are bonded to intersection points between the gate lines and the source lines; and
multiple bit lines that are bonded to one ends of magnetic tunnel junction devices included in the magnetic random access memory cells, respectively, and arranged to be parallel to one another,
wherein the other ends of switching devices and the other ends of the magnetic tunnel junction devices are connected to each other in series,
a magnetic tunnel junction device included in a magnetic random access memory cell bonded to the first source line group and a magnetic tunnel junction device included in a magnetic random access memory cell bonded to the second source line group are connected to the switching devices, respectively, so as not to be adjacent to each other,
the source line is connected to one end of the switching device included in the magnetic random access memory cell, and
the bit line is extended in a direction so as to be connected to one ends of the magnetic tunnel junction devices of adjacent magnetic random access memory cells bonded to a same gate line and adjacent source lines different from each other.

14. The magnetic random access memory of claim 13,
wherein the bit line is extended in a direction so as to be connected to one ends of magnetic tunnel junction devices respectively included in a magnetic random access memory cell bonded to a Nth (N≥1) gate line and a (M+1)th (M≥1) source line and a magnetic random access memory cell adjacent to the magnetic random access memory cell and bonded to the Nth gate line and a (M+2)th source line and
one end of a magnetic tunnel junction device included in a magnetic random access memory cell bonded to a (N+1)th gate line and a Mth source line.

15. The magnetic random access memory of claim 13,
wherein the bit line is extended in a direction so as to be connected to one ends of magnetic tunnel junction devices respectively included in a magnetic random access memory cell bonded to a Nth (N≥1) gate line and a Mth (N≥1) source line and a magnetic random access memory cell adjacent to the magnetic random access memory cell and bonded to the Nth gate line and a (M+1)th source line and
one end of a magnetic tunnel junction device included in a magnetic random access memory cell bonded to a (N+1)th gate line and a (M+2)th source line.

* * * * *